US012175357B2

(12) United States Patent
Kwon et al.

(10) Patent No.: US 12,175,357 B2
(45) Date of Patent: Dec. 24, 2024

(54) DEEP LEARNING-BASED CHANNEL BUFFER COMPRESSION

(71) Applicant: Samsung Electronics Co., Ltd., Gyeonggi-do (KR)

(72) Inventors: Hyukjoon Kwon, San Diego, CA (US); Ramin Soltani, Carlsbad, CA (US); Mu-Sheng Lin, San Diego, CA (US); Jungwon Lee, San Diego, CA (US); Inyup Kang, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 875 days.

(21) Appl. No.: 17/187,151

(22) Filed: Feb. 26, 2021

(65) Prior Publication Data

US 2022/0101109 A1 Mar. 31, 2022

Related U.S. Application Data

(60) Provisional application No. 63/083,296, filed on Sep. 25, 2020.

(51) Int. Cl.
*G06N 3/063* (2023.01)
*G06F 9/30* (2018.01)
*G06F 9/54* (2006.01)
*G06N 3/08* (2023.01)

(52) U.S. Cl.
CPC .......... *G06N 3/063* (2013.01); *G06F 9/3001* (2013.01); *G06F 9/544* (2013.01); *G06N 3/08* (2013.01)

(58) Field of Classification Search
CPC .................................................... G06N 3/0455
See application file for complete search history.

(56) References Cited

U.S. PATENT DOCUMENTS

| 9,692,616 | B1* | 6/2017 | Etkin ................... H04L 25/0202 |
| 10,644,732 | B2 | 5/2020 | Raghavan et al. |
| 2017/0141875 | A1* | 5/2017 | Eliaz ..................... H04L 1/0018 |
| 2019/0356516 | A1 | 11/2019 | Cao et al. |
| 2020/0059822 | A1 | 2/2020 | Ding et al. |
| 2020/0212984 | A1* | 7/2020 | Fellhauer ............. H04B 7/0617 |

OTHER PUBLICATIONS

Lee, Seunghwan, Hyungyu Ju, and Byonghyo Shim. "Pilot assignment and channel estimation via deep neural network." 2018 24th Asia-Pacific Conference on Communications (APCC). IEEE, 2018. (Year: 2018).*
Y. Liu et al., "Channel Estimation for OFDM," IEEE Communications Surveys & Tutorials, vol. 16, No. 4, pp. 1891-1908, Fourthquarter 2014.
Y. Li et al., "Robust Channel Estimation for OFDM Systems with Rapid Dispersive Fading Channels," IEEE Transactions on Communications, vol. 46, No. 7, pp. 902-915, Jul. 1998.

(Continued)

*Primary Examiner* — Eric Nilsson
(74) *Attorney, Agent, or Firm* — The Farrell Law Firm, P.C.

(57) ABSTRACT

A method and system are provided. The method includes performing channel estimation on a reference signal (RS), compressing, with a neural network, the channel estimation of the RS, decompressing, with the neural network, the compressed channel estimation, and interpolating the decompressed channel estimation.

18 Claims, 10 Drawing Sheets

(56) References Cited

OTHER PUBLICATIONS

M. J. Weinberger et al., "The LOCO-I Lossless Image Compression Algorithm: Principles and Standardization into JPEG-LS," IEEE Transactions on Image Processing, vol. 9, No. 8, pp. 1309-1324, Aug. 2000.
M. F. Ukrit et al., "A Survey on Lossless Compression for Medical Images," International Journal of Computer Applications, vol. 31, No. 8, pp. 47-50, 2011.
S. Kodituwakku et al., "Comparison of Lossless Data Compression Algorithms for Text Data," Indian Journal of Computer Science and Engineering, vol. 1, No. 4, pp. 416-425, 2010.
O. K. Al-Shaykh et al., "Lossy Compression of Noisy Images," IEEE Transactions on Image Processing, vol. 7, No. 12, pp. 1641-1652, Dec. 1998.
Theis, W. Shi et al., "Lossy image compression with compressive autoencoders," arXiv:1703.00395v1 [stat.ML] Mar. 1, 2017, pp. 19.
S. E. Marzen et al., "The Evolution of Lossy Compression," arXiv:1506.06138v1 [q-bio.NC] Jun. 19, 2015, pp. 14.
N. Ponomarenko et al., "Lossy Compression of Noisy Images Based on Visual Quality: A Comprehensive Study," EURASIP Journal on Advances in Signal Processing, vol. 2010, pp. 1-13, 2010.
Z. Cheng et al., "Deep Convolutional AutoEncoder-based Lossy Image Compression," arXiv:1804.09535v1 [cs.CV] Apr. 25, 2018, pp. 6.
T. Dumas et al., "Image Compression with Stochastic Winner-Take All Auto-Encoder," 2017 IEEE International Conference on Acoustics, Speech and Signal Processing (ICASSP). IEEE, 2017, pp. 1512-1516.
G. Toderici et al., "Variable Rate Image Compression with Recurrent Neural Networks," arXiv:1511.06085v5 [cs.CV] Mar. 1, 2016, pp. 12.
T. Dumas et al., "Autoencoder Based Image Compression: Can the Learning Be Quantization Independent?," arXiv:1802.09371v1 [eess.IV] Feb. 23, 2018, pp. 5.
A. Habibian et al., "Video Compression With Rate-Distortion Autoencoders," arXiv:1908.05717v2 [eess.IV] Nov. 13, 2019, pp. 14.
C. Y. S. Kin and B. Coker, "Video Compression Using Recurrent Convolutional Neural Networks," published electronically in ARXIV, 2016, pp. 6.
D. Hsu, "Time Series Compression Based on Adaptive Piecewise Recurrent Autoencoder," arXiv:1707.07961v2 [cs.NE] Aug. 16, 2017, pp. 10.
J. Romero et al., "Quantum Autoencoders for Efficient Compression of Quantum Data," arXiv:1612.02806v2 [quant-ph] Feb. 10, 2017, pp. 10.
A. Pepper et al., "Experimental Realization of a Quantum Autoencoder: The Compression of Qutrits via Machine Learning," arXiv:1810.01637v2 [quant-ph] Feb. 15, 2019, pp. 7.
P. Yin et al., "Understanding Straight-Through Estimator in Training Activation Quantized Neural Nets," arXiv:1903.05662v4 [cs.LG] Sep. 25, 2019, pp. 30.
R. A. Shafik et al., "On the Error Vector Magnitude as a Performance Metric and Comparative Analysis," 2006 International Conference on Emerging Technologies, Nov. 2006, pp. 27-31.
3GPP TS 36.211 version 16.2.0 Release 16 ETSI TS 136 211 V16.2.0 (Sep. 2020), pp. 249.
3GPP TS 38.211 v16.1.0 (Mar. 2020), 3rd Generation Partnership Project; Technical Specification Group Radio Access Network; NR; Physical channels and modulation (Release 16), pp. 130.
Cheng, Yu et al., "A Survey of Model Compression and Acceleration for Deep Neural Networks", arXiv:1710.09282v9 [cs.LG] Jun. 14, 2020, pp. 10.
Zaminipour, Makan et al., "A Survey on Deep-Learning based Techniques for Modeling and Estimation of MassiveMIMO Channels", arXiv:1910.03390v2 [cs.IT] Jan. 18, 2020, pp. 12.

* cited by examiner

702

704

802

804

DEEP LEARNING-BASED CHANNEL BUFFER COMPRESSION

PRIORITY

This application is based on and claims priority under 35 U.S.C. § 119(e) to U.S. Provisional Patent Application Ser. No. 63/083,296, filed on Sep. 25, 2020, the entire contents of which are incorporated herein by reference.

FIELD

The present disclosure is generally related to neural network deep learning utilizing compression.

BACKGROUND

In coherent detection, the receiver requires a block to perform channel estimation (CE) (i.e., estimate the channel gains impacting signals sent from the transmitter to the receiver). In addition, in a system with multiple receive antennas, CE is necessary for interference cancellation or diversity combining. Although non-coherent detection methods (e.g., differential phase shift keying) can avoid channel estimation, they result in a loss of 3-4 dB in the signal-to-noise ratio (SNR).

CE is carried out with the aid of pilot signals (e.g., demodulation reference signals (DMRS)). In an orthogonal frequency-division multiplexing (OFDM) system, DMRS is inserted into subcarriers of symbols at the transmitter. The receiver estimates the channel at DMRS symbol locations from the received signals and stores them in a buffer. The data in the CE buffer is extracted and interpolated in the time domain for detection of a physical downlink shared channel (PDSCH). As the number of subcarriers increases, a larger amount of memory for CE data is required. Hence, data compression plays an important role by saving the memory space when large bandwidth is allocated.

SUMMARY

According to one embodiment, a method includes performing channel estimation on a reference signal (RS), compressing, with a neural network, the channel estimation of the RS, decompressing, with the neural network, the compressed channel estimation, and interpolating the decompressed channel estimation.

According to one embodiment, a system includes a memory and a processor configured to perform channel estimation on an RS, compress, with a neural network, the channel estimation of the RS, decompress, with the neural network, the compressed channel estimation, and interpolate the decompressed channel estimation

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
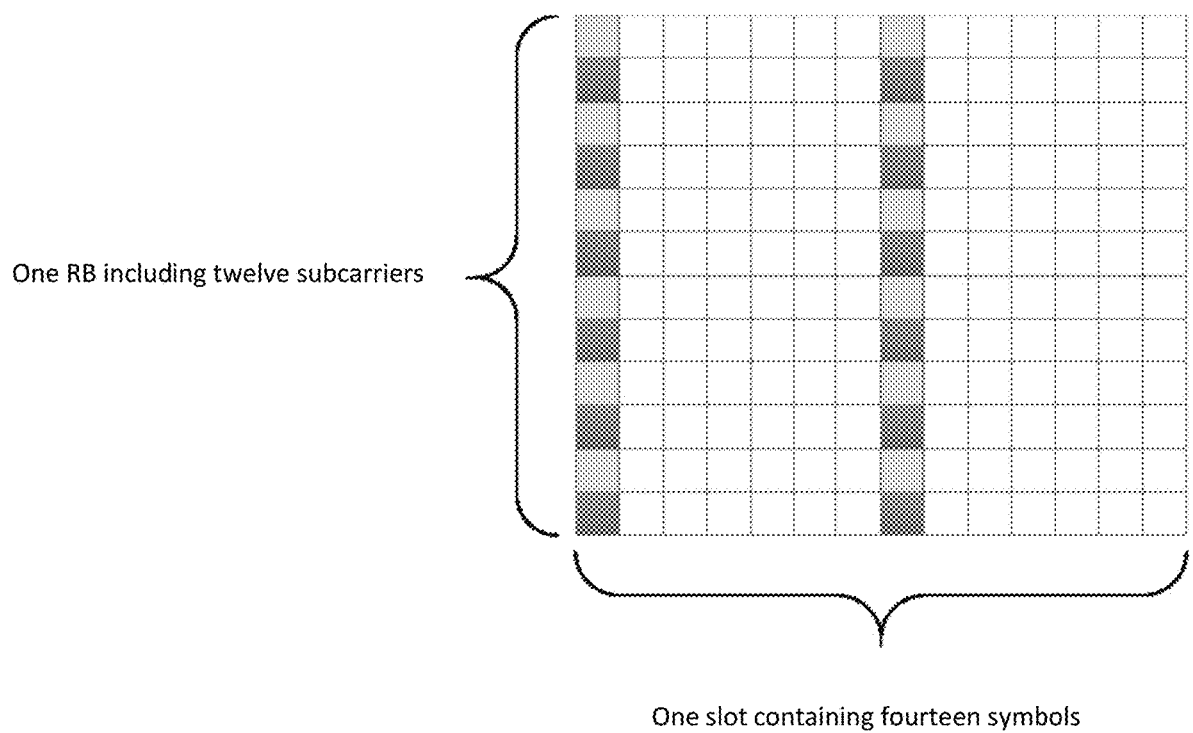
FIG. 1 illustrates a diagram of a PDSCH-DMRS, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

The systems and methods disclosed herein provide an effective method of channel buffer compression for a $5^{th}$ generation (5G) new radio (NR) baseband modem application by using deep learning techniques. Specifically, the system utilizes an autoencoder for compression/decompression of CE data. The CE values are stored at DMRS symbol locations in a buffer. For the detection of the PDSCH, the CE values are loaded from the buffer and interpolated in the time domain. Since the number of stored channel estimates increases as the number of subcarriers increases, a large amount of storage is required for a user equipment (L'E) to support large bandwidth. Therefore, CE buffer compression plays a significant role in saving the space required for storing the CE data when dealing with a large number of subcarriers. The system provides training and testing of an autoencoder, which is then split it into a compressor and decompressor.

Data compression involves representing information using fewer bits, and it divides into categories, such as lossless and lossy compression. Lossless compression removes redundancies such that no data is lost. Hence, the original data can be recovered. However, lossy compression achieves better compression by eliminating some less important information. Although, for lossy compression, the result of decompression is not exactly equal to the original data due to loss of some information, an acceptable version of original data can be recovered. In other words, lossy results in better compression at the cost of quality loss. For instance, lossy compression results in significantly reduced file size for images.

An autoencoder (i.e., a neural network that copies the input to the output) is utilized. Autoencoders have been used widely for compression of images, videos, time series, and quantum data. For ease of implementation, the autoencoder described herein has only one hidden layer. Through simulations, hyperparameters of the autoencoder are selected, such as activation functions, the number of input nodes, batch size, etc. Using the selected hyperparameters, final simulations are conducted to present results. One challenge is training the autoencoder using quantized values at the hidden layer to mimic the digital storage constraint of CE. In other words, a quantization function goes on top of the activation function at the hidden layer. However, the gradient of the quantization function is almost zero except some points with infinity value. The quantization function can be replaced with an alternative function in the back-propagation to achieve acceptable results.

The following definitions are utilized throughout the description.

Two's complement of sequence of bits b is obtained by inverting the bits of b, then adding one.

Signed fixed-point representation of a real number x, with word length W and fraction length F is the sequence of bits $b=(b_W, b_{W-1}, \ldots, b_F, \ldots, b_1)$ which consists of a sign bit $b_W$, integer part $(b_{W-1}, \ldots, b_{F+1})$, and fraction part $(b_F, \ldots, b_1)$. Denote by $b'=(b'_W, b'_{W-1}, \ldots, b'_F, \ldots, b'_1)$ is the two's complement of b. The decimal value of b is given by Equation (1).

$$2^{-F}\left(-b_w 2^{w-1} + \sum_{i=1}^{w-1} b_i 2^{i-1}\right) \quad (1)$$

The range of b is $[-2^{W-F-1}, 2^{W-F-1}]$. For instance, if $b=(1,0,1)$ with fraction length F=2, then the decimal value of b is 0.25 (−4+1)=−0.75. The decimal value of a sequence of bits b with W=3 and F=2 is in range [−1,0.75], For a real number x, the fixed-point quantization function is as in Equation (2):

$$q_{FXP}(x) = f_{clip}\left(2c\left\lfloor \frac{x+c}{2c} \right\rfloor + c, -s, s\right) - c \quad (2)$$

and, as in Equation (3).

$$f_{clip}(x, a, b) \begin{cases} a, & x \le a \\ x, & a \le x \le b \\ b, & x \ge b \end{cases} \quad (3)$$

$$c = 2^{-F-1}$$

$$s = c2^w - c$$

In one example, floating point representation of a real number x, with word length W and mantissa length $\ell$ is the sequence of bits $b=(b_W, b_{W-1}, \ldots, b_\ell, b_1)$ which includes exponent $(b_W, \ldots, b_{\ell+1})$ and mantissa $(b_\ell, \ldots, b_1)$. The two bits of exponents are unsigned. Hence, the decimal value of the exponent is, as in Equation (4).

$$E = \sum_{i=\ell+1}^{w} b_i 2^{i-1} \quad (4)$$

The mantissa is signed and if the sigh bit is $b_\ell=0$, it is positive. Otherwise, it is negative. The disclosure uses two's complement for interpretation of mantissa when it is negative. Then, as in Equation (5).

$$M = -b_\ell 2^{\ell-1} + \sum_{i=1}^{\ell} b_i 2^{i-1} \quad (5)$$

Therefore, the decimal value of b is given by Equation (6).

$$2^E M \quad (6)$$

Since $1 \leq E \leq E_{max} = 2^{2^{W-\ell}-1}$ and $-2^\ell - 1 \leq M \leq 2^{\ell-1} - 1$, the range of b is as in Equation (7).

$$[-E_{max} 2^{\ell-1}, E_{max} 2^{\ell-1} - E_{max}] = [-2^{2^{W-\ell}-1},$$
$$2^{2^{W-\ell}+\ell-2} - 2^{2^{W-\ell}-1}] \quad (7)$$

For instance, if two bits for the exponent w−l=2 and nine bits for the mantissa (l=9) are allocated, then the range of b is [−2048, 2040]. For a real number x, the floating-point quantization is as in Equation (8).

$$q_{FLP}(x) \begin{cases} \lfloor x \rfloor & \text{if } -2^{\ell-1} \leq x \leq 2^{\ell-1} - 1 \\ 2\lfloor \frac{x}{2} \rfloor & \text{else if } -2^\ell \leq x \leq 2^\ell - 2 \\ \vdots & \vdots \\ 2^{2^{w-\ell}-1} & \text{else if } -2^{2^{w-\ell}}2^{\ell-1} \leq x \leq 2^{2^{w-\ell}}2^{\ell-1} - 2^{2^{w-\ell}} \end{cases} \quad (8)$$

The compression ratio is defined as in Equation (9).

$$\frac{\text{Uncompressed Size}}{\text{Compressed Size}} \quad (9)$$

The mean squared error (MSE) for a vector $X=(X_1, \ldots, X_n)$ and its prediction $\hat{X}=(\hat{X}_1, \ldots, \hat{X}_n)$ is defined as in Equation (10).

$$MSE(X, \hat{X}) = \frac{\sum_{i=1}^{n} (X_i - \hat{X}_i)^2}{n}. \quad (10)$$

The normalized mean squared error (NMSE) for a vector $X=(X_1, \ldots, X_n)$ and its prediction $\hat{X}=(\hat{X}_1, \ldots, \hat{X}_n)$ is defined as in Equation (11).

$$NMSE(X, \hat{X}) = \frac{\sum_{i=1}^{n} (X_i - \hat{X}_i)^2}{\sum_{i=1}^{n} X_i^2}. \quad (11)$$

Herein, error vector magnitude (EVM) is also used, which is defined as in Equation (12).

$$EVM(X, \hat{X}) = \sqrt{\frac{\sum_{i=1}^{n} (X_i - \hat{X}_i)^2}{\sum_{i=1}^{n} X_i^2}}. \quad (12)$$

The EVM is the square root of NMSE. The EVM may expressed as a percentage as in Equation (13).

$$EVM(\%) = \sqrt{\frac{\sum_{i=1}^{n} (X_i - \hat{X}_i)^2}{\sum_{i=1}^{n} X_i^2}} \times 100(\%) \quad (13)$$

According to the 3GPP specification, a resource element (RE) is the smallest element in the OFDM system, which includes one subcarrier in the frequency domain and one symbol in the time domain, and a resource block (RB) includes twelve consecutive subcarriers in the frequency domain in NR. Denote by $N_{RB}$ the total number of RBs in the channel bandwidth. Hence, the total number of subcarriers per symbol is $12 \times N_{RB}$. First, the disclosure give details on the system model for NR and then LIE. For LTE, normal cyclic prefix (NCP) and extended cyclic prefix (ECP) and multicast service single frequency network (MBSFN) reference signal (MRS) are considered FIG. 1 illustrates a diagram of a PDSCH-DMRS, according to an embodiment. For NR, a normal cyclic prefix is considered, so each slot includes 14 symbols. Also, a PDSCH DMRS is used to estimate the channel. FIG. 1 illustrates an example of 6 PDSCH-DMRS (in a configuration type 1 case) subcarriers per RB and 2 PDSCH-DMRS symbols per slot. For CE estimation, the channel is first estimated for the REs with PDSCH-DMRS (total of 2 PDSCH-DMRS symbols×6 REs per PDSCH-DMRS symbol for PDSCH-DMRS configuration type 1 in the symbols). Then, these are interpolated in the frequency domain to estimate the channel for PDSCH in those symbols. Finally, the 12 complex channel coefficients per RB are stored. For demodulation, first, a total of 12 complex channel coefficients per RB for each symbol with PDSCH-DMRS are loaded. Then, these are interpolated in the time domain to estimate the channel coefficients for PDSCH in other symbols.

For each symbol with PDSCH-DMRS, 12 complex elements per RB are compressed and store the compressed representations of the estimated channel in CE buffer. For demodulation, the estimated channel values are loaded and decompressed from the CE buffer, and then interpolated in the time domain.

For fixed-point (FXP) (12s, 12s), each channel coefficient $C_i=R_i+j\, I_i$ contains 24 bits, 12 bits for the real part $R_i$ and 1.2 bits for the imaginary part $1_i$, with fraction length of zero. Each $R_i$ (or $1_i$) has 12 bits with the range (−2048, ..., −1, 0, 1, ..., 20471. The system utilizes polar coordinate representation for $C_i$, which is converted from the Cartesian representation.

For floating-point (FLP) (2u, 9s, 9s), each complex channel coefficient $C_i$ consists of 20 bits. The first two bits are $E_i$, the shared exponent between the real and imaginary parts, the next nine bits are $M_{R,i}$, the mantissa of the real part, and the next nine bits are $M_{I,i}$, the mantissa of the imaginary part. Each $R_i$ (or $I_i$) has 12 bits with the range (−2048, ..., −1, 0, 1, ..., 20401.

FLP (2u, 9s, 9s) implies that a total of 24 bits are compressed to 20 bits, since the real and imaginary parts share the common exponent to suppress the dynamic range of the signal.

For LTE NCP, cell-specific reference signal (CRS) symbols are fixed at the locations of 0, 4, 7, 11 OFDM symbols, and contrary to the configurable PDSCH-DMRS symbols in NR. Two CRS's in LTE from different antenna ports do not overlap to each other while PDSCH-DMRS in NR uses orthogonal cover code (OCC), which allows overlapping of PDSCH-DMRS's from different antenna ports.

Figure 2:
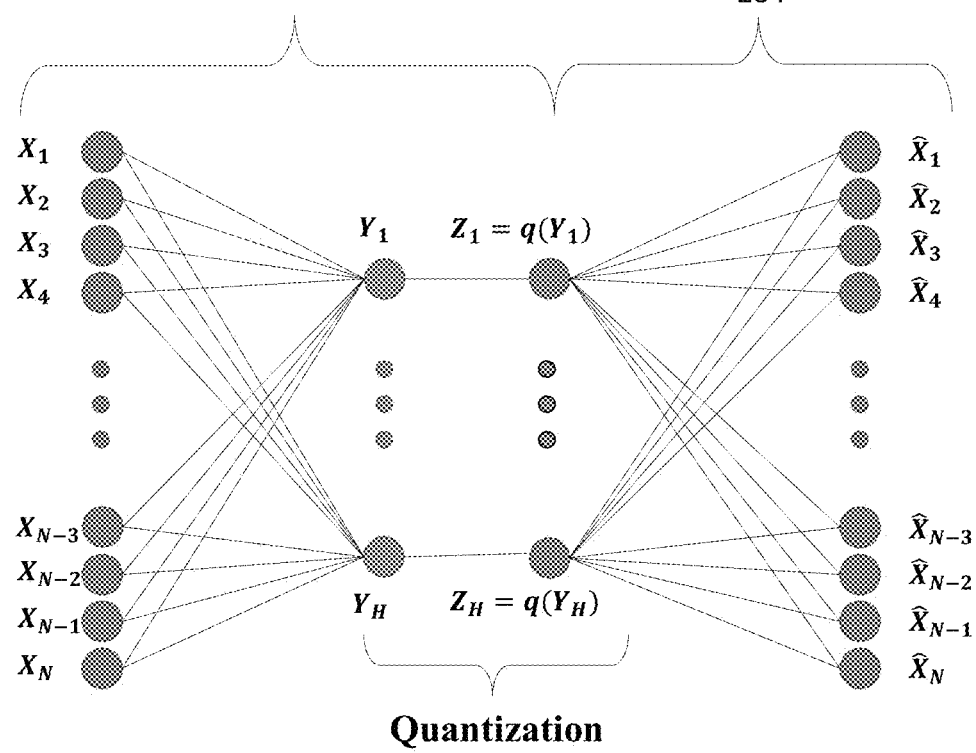
FIG. 2 illustrates a diagram of an autoencoder, according to an embodiment.

Channel coefficients are represented using the FXP (11s, 11s) format. Each channel coefficient $C_i = R_i + j\ I_i$ contains 22 bits, 11 bits for the real part $R_i$ and 11 bits for the imaginary part $I_i$. This is denoted by FXP (11s, 11s). Each $R_i$ (or $I_i$) has 11 bits with the range $\{-1.024, \ldots, -1, 0, 1, \ldots, 1024\}$ For LTE ECP, CRS frequency density is the same as LTE NCP while the locations of CRS symbols are different due to 12 OFDM symbols per subframe, not 14 in LTE NCP cases. On multimedia broadcast multicast service (MBMS) applications, at the multimedia broadcast multicast service single frequency network (MBSFN), the MBSFN region is always with an ECP mode. Channel coefficients for LTE ECP are represented using the FXP (11s, 11s) format, same as that for LIE NCP, FIG. 2 illustrates a diagram of an autoencoder 200, according to an embodiment. The autoencoder 200 includes a compressor 202 and a decompressor 204. An autoencoder may be defined as a neural network attempting to copy its input to its output. The values at the hidden layer(s) can be considered as a code representing the input. For ease of implementation, an autoencoder with one hidden layer is described herein. An important property of this type of neural network is that it copies only approximately (i.e., copy only the input that resembles the training data in statistical sense). The typical usage of the autoencoder 200 is to learn lower dimension representation at the hidden layer from the inputs, which may be useful as a compressor/decompressor pair.

The autoencoder 200 may first map the input vector $X = X_N$) to the values at the hidden layer according to the weights $W_{i,j}^{(1)}$ ($1 \leq i \leq N$ and $1 \leq j \leq H$), biases $b_j^{(1)}$s, and activation function $f_1(\cdot)$ at the hidden layer, as in Equation (14).

$$Y_j = f_1\left(b_j^{(1)} + \sum_{i=1}^{N} W_{i,j}^{(1)} X_i\right). \tag{14}$$

The autoencoder 200 may then quantize the values at the hidden layer, according to fixed point quantization with word length W and fraction length $F: Z_j = q_{FXP}(Y_j)$. This is a uniform scalar quantization. This step is performed due to digital memory used for the values at the hidden layer. A typical autoencoder does not perform this step.

The autoencoder 200 may then map Z to the decompressed version of X, $\tilde{X}$ according to the weights $W_{i,j}^{(2)}$, and bias $b_i^{(2)}$s, and activation function $f_2(\cdot)$ at the output layer, as in Equation (15).

$$\tilde{X}_t = f_2\left(b_i^{(2)} + \sum_{j=1}^{H} W_{j,i}^{(2)} Z_j\right). \tag{15}$$

A clipping function (as defined in Equation (5)) may be used on top of another function to make $f_2(\cdot)$ produces values only in the range of the input. The autoencoder 200 is trained to set $W_{i,j}^{(1)}$, $W_{i,j}^{(2)}$, $b_i^{(1)}$, $b_i^{(2)}$ resulting small compression loss. Then, it is split into the compressor 202, which performs the first and second step described above, and the decompressor 204, which performs the third step described above.

Multiple autoencoder schemes may be utilized. For both NR and LTE, the same compressor/decompressor is used for all RBs and all symbols. The only difference between NR and LTE compression is the range of channel coefficients. This difference affects only a normalization factor. As described below, denote by $C_1, \ldots, C_{12}$ the channel coefficients across one RB for a symbol with PDSCH-DMRS, where $C_i = R_i + jI_i$ for $1 \leq i \leq 12$. Denote by $\hat{R}_i, \hat{I}_i, \hat{C}_i$ the decompressed versions of respectively. $R_i, I_i$ is normalized before compression and denormalized after decompression. A normalization factor of 2048 is used for NR and 1024 for LTE, respectively, according to the range of channel coefficients.

24 values (12 $R_i$s and 12 $I_i$s) can be compressed/decompressed either together using an autoencoder of 24 inputs or separately using an autoencoder of 12 inputs. In addition, $C_i$s can be in FXP format or FLP format. Hence, four schemes are provided in general. The case of using an autoencoder of 12 inputs can be excluded when the input data is in FLP format because of G2's preference and the fact that an autoencoder of 24 inputs achieves a better performance.

Figure 3:
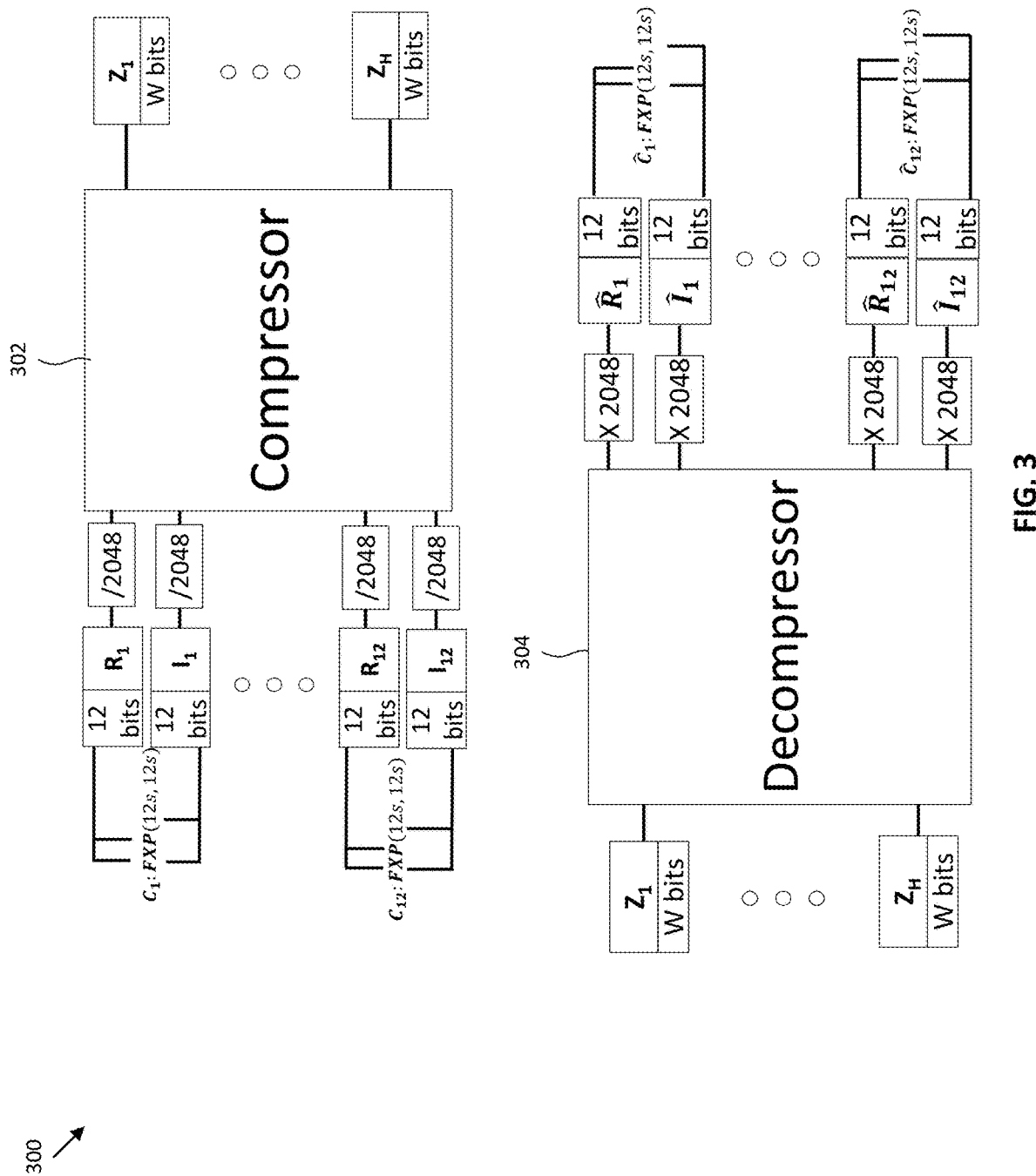
FIG. 3 illustrates a diagram of an autoencoder scheme, according to an embodiment.

FIG. 3 illustrates a diagram of an autoencoder scheme, according to an embodiment. The autoencoder scheme 300 includes a compressor 302 and a decompressor 304, and represents an autoencoder with 24 inputs, $C_i$s in FXP) (12s, 12s) format. The compressor 302 with 24 inputs is used to compress $R_1, \ldots, R_{12}$ and $I_1, \ldots, I_{12}$ together. Similarly, one decompressor 304 with 24 outputs is used to decompress 12 real parts and 12 imaginary parts, together. Since twelve $C_i$s are mapped, each of 24 bits to H values, each of W bits, the compression ratio is as in Equation (16).

$$\frac{12 \times 24}{W \times H} \tag{16}$$

In another autoencoder scheme with 12 inputs, $C_i$s in FXP (12s, 12s) format, a compressor with 12 inputs is used to compress $R_1, \ldots, R_{12}$ or $I_1, \ldots, I_{12}$, separately. Similarly, one decompressor with 12 outputs is used to decompress 12 real parts or 12 imaginary parts, separately. Since twelve $C_i$s are mapped, each of 24 bits to 2H values, each of W bits, the compression ratio is as in Equation (17), $$\frac{12 \times 12}{W \times H} \tag{17}$$

Figure 4:
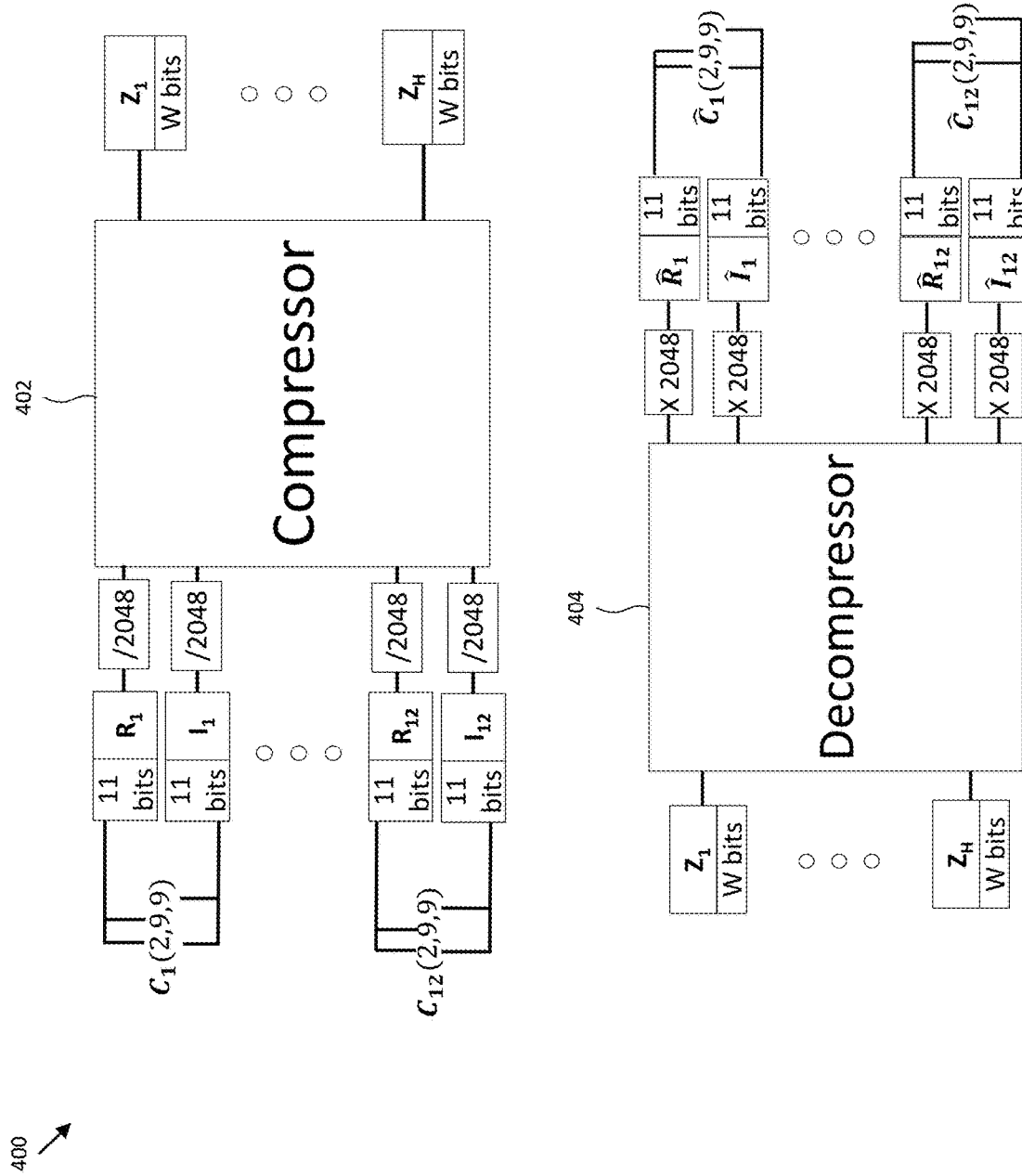
FIG. 4 illustrates a diagram of an autoencoder scheme, according to an embodiment.

FIG. 4 illustrates a diagram of an autoencoder scheme, according to an embodiment. The autoencoder scheme 400 includes a compressor 402 and a decompressor 404. The autoencoder scheme includes an autoencoder with 24 inputs, $C_i$s in FLP (2u, 9s, 9s) format. The compressor 402 with 24 inputs is used to compress $R_1, \ldots, R_{12}$, and $I_1, \ldots, I_{12}$, together. Similarly, the decompressor 404 with 24 outputs is used to decompress 12 real parts and 12 imaginary parts together. The channel coefficients are expanded from 20 bits to 22 bits before compression. This expansion will be compensated with overall compression. Since twelve $C_i$s are mapped, each of 20 bits to H values, each of W bits, the compression ratio is as in Equation (18).

$$\frac{12 \times 20}{W \times H} \quad (18)$$

Because, $\hat{C}_i$s are in FLP (2u, 9s, 9s), the estimation of $\hat{C}_i$ from $\hat{R}_i$ and $\hat{I}_i$ is not trivial. The shared exponent and mantissa parts are calculated from $\hat{R}_i$ and $\hat{I}_i$.

When the input is in FLP (2u, 9s, 9s) format, there are six possible compression candidates. Through simulation, it is shown that the third scheme results in minimum decompression loss. Due to the fact that for LIE channel coefficients are in FXP (11s, 11s) format, the compression ratios for the first and second schemes become, as in Equations (19) and (20), respectively.

$$\frac{11 \times 24}{W \times H}, \quad (19)$$

$$\frac{11 \times 12}{W \times H}, \quad (20)$$

For quantization, the autoencoder performs quantization at the hidden layer. FXP (12s, 12s) is used at the hidden layer. For quantization, the system may train and test the autoencoder considering the quantization at the hidden layer only in the forward-propagation (i.e., disregarding the quantization function in the back propagation). For forward pass, accurate quantization $q_{FXP}(x)$ is used, but for back propagation, the following function is used instead of the derivative of $q_{FXP}(x)$, as in Equation (21).

$$g(x) = \begin{cases} 1, & -2^{W-F-1} \leq x \leq 2^{W-F-1} - 2^{-F} \\ 0, & \text{otherwise} \end{cases} \quad (21)$$

From Equation (3), the range of quantization function $q_{FXP}(x)$ is $[-2^{W-F-1}, 2^{W-F-1}-2^{-F}]$. Therefore, during back propagation, if $g(x)$ gets an input x outside of the range of quantizer $q_{FXP}(x)$, $W_{i,j}^{(1)}$ will not change. Otherwise, $W_{i,j}^{(1)}$ will change without being impacted by quantization.

The inputs and outputs of the autoencoder are quantized in hardware implementations. Two different formats are available in implementation: 1) FXP (12s, 12s) for inputs and outputs; or, 2) FLP (2u, 9s, 9s) for the inputs and outputs.

Figure 5:
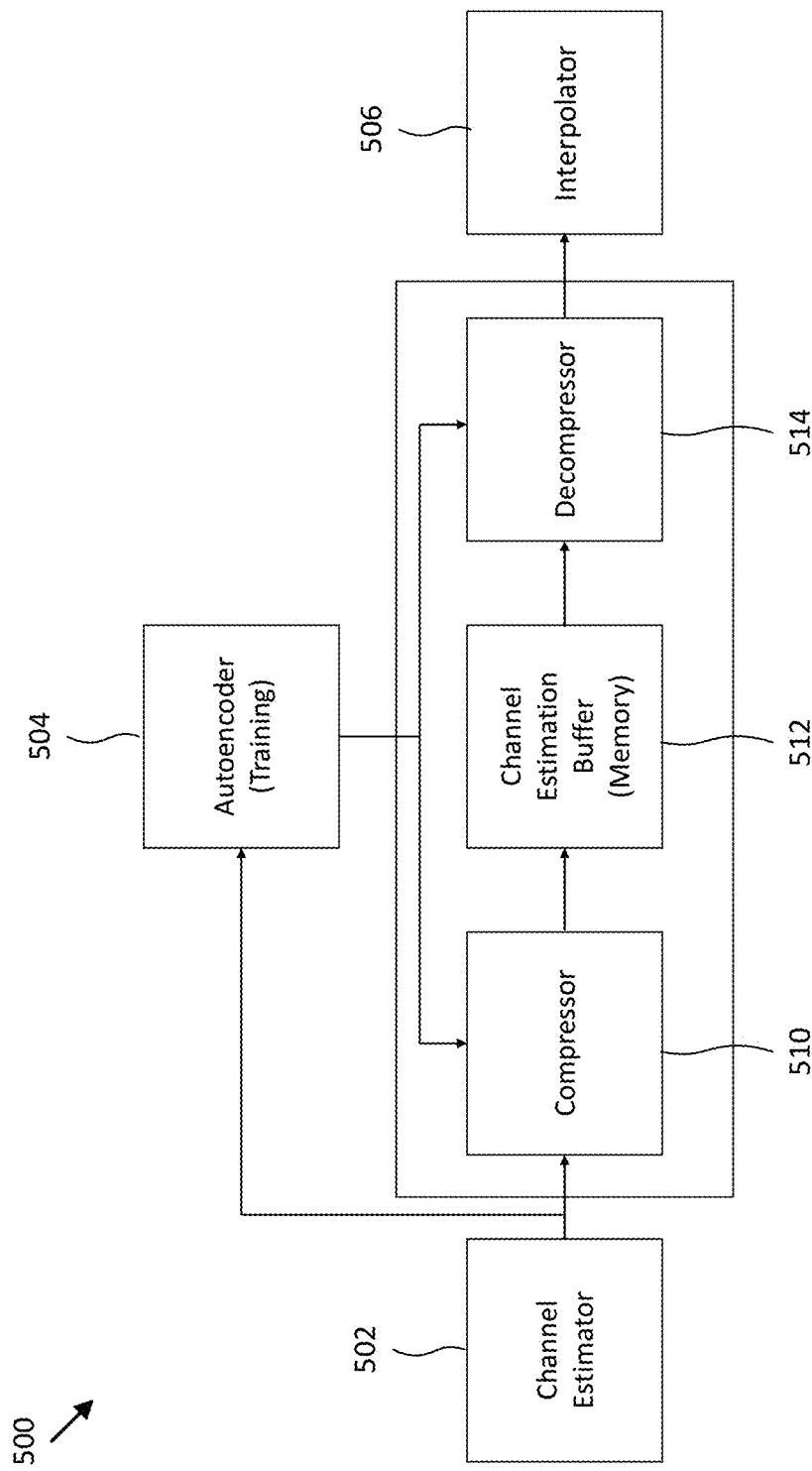
FIG. 5 illustrates a diagram of a network, according to an embodiment.

FIG. 5 illustrates a diagram of a network, according to an embodiment. The network 500 represents an architecture for FXP (12s, 12s) mode at inputs and outputs. The network 500 includes a channel estimator 502, an autoencoder 504, and an interpolator 506. The autoencoder 504 includes a compressor 510, a channel estimation buffer 512 and a decompressor 514. The outputs from channel estimator 502 (either wideband or narrowband) are FXP (12s, 12s). The outputs from the decompressor 514 are also FXP (12s, 12s) before the interpolation 506. The number of nodes at the hidden layer is denoted by H and the word length (W) is 11 on each node at the hidden layer. Other values for W are also possible. Interpolation may be performed over time or over frequency.

Figure 6:
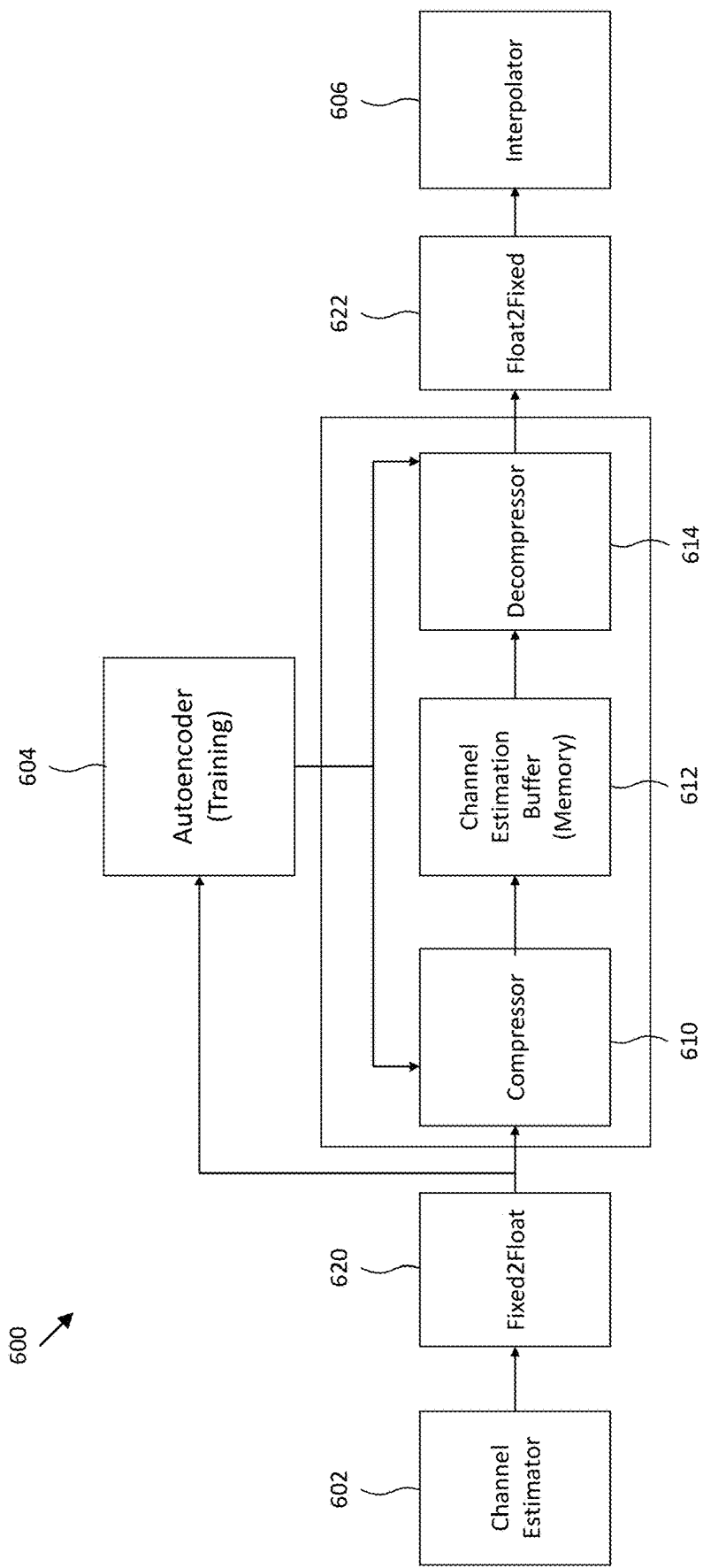
FIG. 6 illustrates a diagram of a network, according to an embodiment.

FIG. 6 illustrates a diagram of a network, according to an embodiment. The network 600 represents an architecture for FLP (2u, 9s, 9s) mode at inputs and outputs. The network 600 includes a channel estimator 602, an autoencoder 604, and an interpolator 606. The autoencoder 604 includes a compressor 610, a channel estimation buffer 612 and a decompressor 614. The network 600 also includes a fixed-to-float converter 620 and a float-to-fixed converter 622. Compared to the FXP mode, the output format of channel estimator 602 and input format of the interpolator 606 are FXP (12s, 12s) format while the inputs and outputs of the autoencoder 604 are in FLP (2u, 9s, 9s) format. After decompression, the system converts each pair of real and imaginary part to FLP (2u, 9s, 9s). This requires calculating the common exponent between the real and imaginary parts. Interpolation may be performed over time or over frequency.

The output of the decompressor is denormalized to obtain $\hat{R}_i$ and $\hat{I}_i$, for $1 \leq i \leq 12$. Next, $C_i$, is estimated from $R_i$ and $I_i$, which includes calculating the exponent common between $R_i$ and $I_i$, Denote by $\hat{C}_i$ the estimation (or decompressed version) of $C_i$. To obtain $\hat{C}_i$, from each pair of $\hat{R}_i$, and $\hat{I}_i$, $\hat{E}_i$, $\widetilde{M_{R,i}}$, $\widetilde{M_{I,i}}$ are obtained, which are estimations of $E_i$, $M_{R,i}$, $M_{I,i}$, respectively. Once the common exponent $\hat{E}_i$ is set, there is only one possibility for $\widetilde{M_{R,i}}$, $\widetilde{M_{I,i}}$, as in Equations (22) and (23), $$\widetilde{M_{R,i}} = f_{clip}\left(\left\lfloor\frac{\hat{R}_i}{\hat{E}_i}\right\rfloor, -256, 255\right) \quad (22)$$

$$\widetilde{M_{I,i}} = f_{clip}\left(\left\lfloor\frac{\hat{R}_i}{\hat{E}_i}\right\rfloor, -256, 255\right) \quad (23)$$

The clipping function in Equations (22) and (23) is due to the fact that the mantissa has a range of [−256, 255]. The optimal method results in a minimal error, where the error is, as in Equation (24):

$$Err = |\hat{R}_i - \hat{E}_i \cdot \widetilde{M_{R,i}}| + |\hat{I}_i - \hat{E}_i \cdot \widetilde{M_{I,i}}| \quad (24)$$

where $\hat{E}_i \in \{1, 2, 4, 8\}$. One way to obtain the optimal $\hat{E}_i$ is brute-force, by trying all four possibilities of $\hat{E}_i$. Hence, this method may not take a long time for a single pair of $\hat{E}_i$ and $\hat{I}_i$. However, since this must be performed this for every $C_i$, given the large number of samples ($10^5$-$10^7$), an alternative method which is faster is considered. The activation function at the output of the autoencoder is set such that it produces the values in range of the input. Therefore, $\hat{R}_i, \hat{I}_i, \in [-2048, 2040]$.

Thus, the alternative method may include estimating the exponent for $\hat{R}_i$ and disregarding $\hat{I}_i$, as in Equation (25):

$$\widetilde{E_{R,i}} = f_{exp}(\hat{R}_i), \quad (25)$$

where, as in Equation (26).

$$f_{exp} = \begin{cases} 1, & \text{if } -256 \leq x \leq 256, \\ 2, & \text{else if } -512 \leq x \leq 512, \\ 4, & \text{else if } -1024 \leq x \leq 1024, \\ 8, & \text{else (which implies } -2048 \leq x \leq 2048) \end{cases} \quad (26)$$

Then, the alternative method may include estimating the exponent for $\hat{I}_i$ disregarding, as in Equation (27).

$$\widetilde{E_{I,i}} = f_{exp}(\hat{I}_i), \quad (27)$$

Then the alternative method may set the following, as in Equation (28).

$$\hat{E}_l = \text{Max}\{\widehat{E_{R,l}}, \widehat{E_{I,l}}\} \qquad (28)$$

Compression may be performed as Cartesian coordinate compression. The inputs of the neural network for compression are from estimated channel outputs (bundle based channel estimation (BBCE)/non-bundle based channel estimation (NBCE)), which are in I (in-phase) and Q (quadrature) formats. Also, signals in I and Q within one RB are not expected to vary much. Hence, it is natural to perform compression in the Cartesian coordinates. Secondly, signals in I and Q axes are not totally independent in the sense of signal dynamic range.

For the loss function on the Cartesian coordinates, the MSE from Equation (10) and the EVM from Equation (12) are utilized. This is because of the choice of Euclidean distance as "closeness" between two points in Cartesian coordinates.

Figure 7:
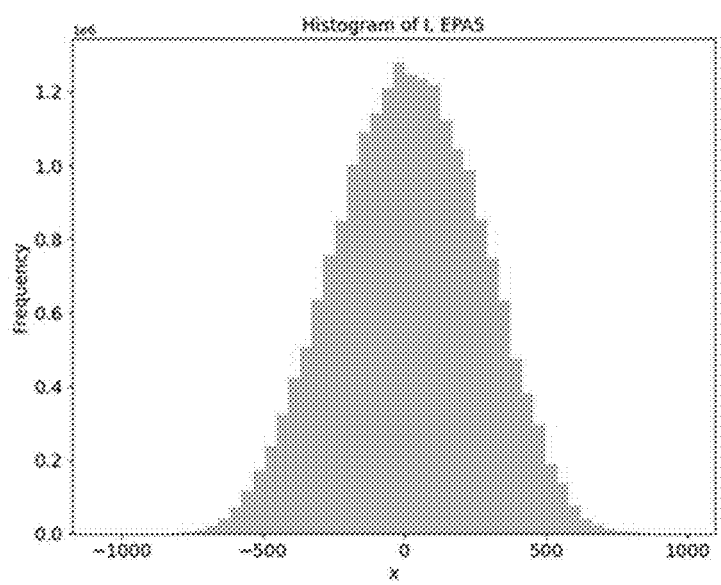
FIG. 7 illustrates histograms of distributions, according to an embodiment.
Figure 7:
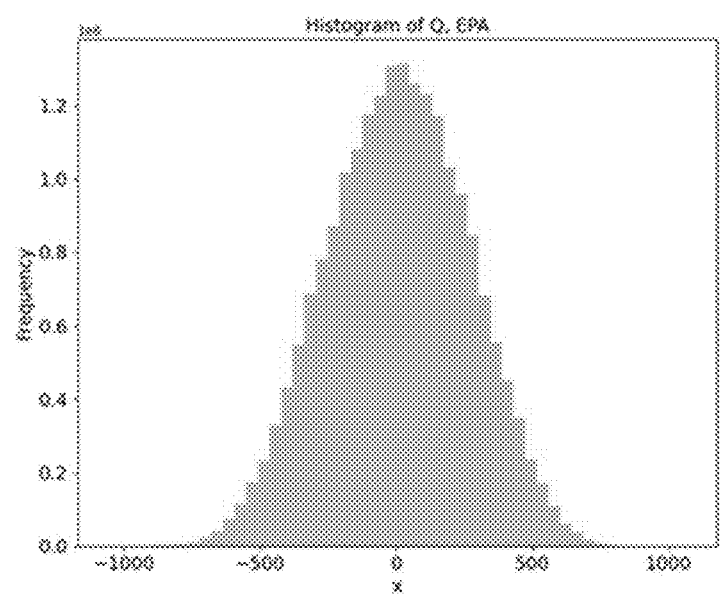

FIG. 7 illustrates histograms of distributions, according to an embodiment. The histogram 702 is a histogram of I distributions, and histogram 704 is a histogram of Q distributions. As shown in FIG. 7, the distributions of I and Q are Gaussian. Therefore, there are two approaches for the Cartesian coordinate compression: a 12-node-based compression and a 24-node-based compression. For the 12-node-based compression scheme, the neural network is trained by randomly selecting/mixing the observations from I and Q and that network is applied to predict/compress for both I and Q individually. For 24-node-based compression, both of the two axes are trained together within the neural network.

In polar compression, instead of compression of the real and imaginary parts of channel coefficients, the magnitude and phase of them can be compressed. A single-tap channel with frequency offset can be fully characterized by three independent variables: slope, y-intercept of the phase, and magnitude. In other words, for a large number of subcarriers, if the channel model is single-tap, the polar representation of the channel coefficients (phase and magnitude) forms a compressed representation. The same idea may be extended to a general channel with multi-taps. The phases and magnitudes of the channel coefficients for neighbor subcarriers are correlated.

For polar compression, two loss functions are considered. The first approach is to simply apply the MSE directly to magnitude and phase of the polar representation, as in Equation (29).

$$\text{polar loss} = \frac{\sum_i |A_i - \hat{A}_i|^2 + \sum_i |\theta_i - \hat{\theta}_i|^2}{n} \qquad (29)$$

The second approach is to convert the polar representation to Cartesian representation and then to apply the Euclidean distance to measure the MSE, as in Equation (30).

$$\text{Cartesian loss} = \frac{\sum_i |A_i \cos\theta_i - \hat{A}_i \cos\hat{\theta}_i|^2 + \sum_i |A_i \sin\theta_i - \hat{A}_i \sin\hat{\theta}_i|^2}{n} \qquad (30)$$

Figure 8:
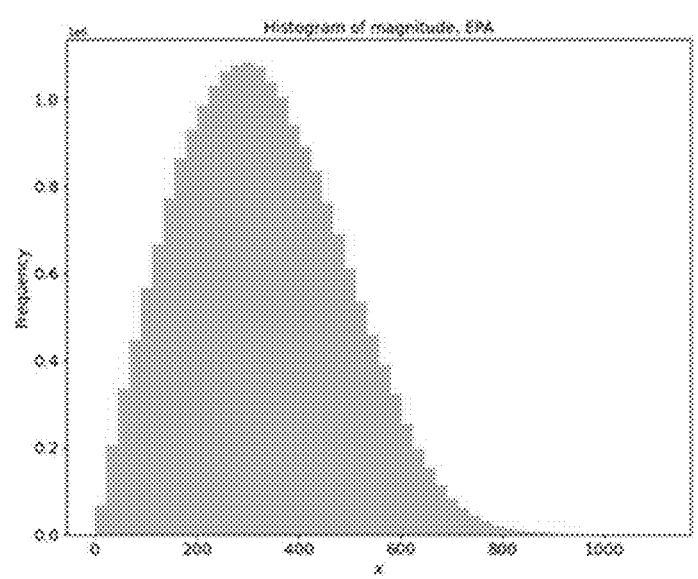
FIG. 8 illustrates histograms of input features in polar coordinates, according to an embodiment.
Figure 8:
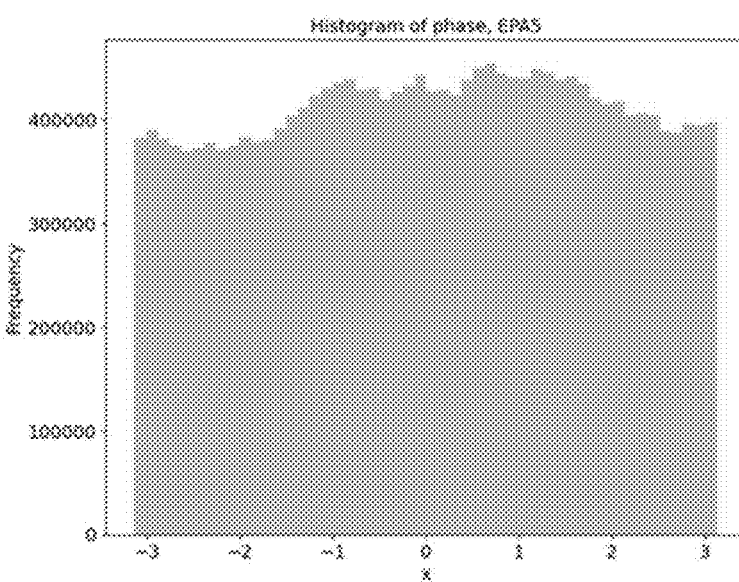

FIG. 8 illustrates histograms of input features in polar coordinates, according to an embodiment. Histogram 802 is a histogram of magnitude and histogram 804 is a histogram of phase.

For training, three networks are considered: one network for NR-frequency range (FR)1 and LTE-NCP, one network for NR-FR2, and one network for LTE-ECP, For training those data, one of the three datasets described below is picked for its own network, and shuffle the samples. Then, the selected subset is divided into training and test set. The portions allocated for training and test is 90% and 10%.

For LTE and NR coexistence, it is beneficial from a memory prospect to reuse the weights/bias of the neural network trained from NR-FR1 to LIE normal cyclic prefix (NCP) mode. Based on the simulation, the result shows supportive evidence to utilize the same neural network for both NR-FR1 and LIE-NCP scenarios.

The NR FR1 neural network is trained by the NR-FR1 dataset at SNR in $\{10, 12, \ldots, 42\}$ dB on both BBCE/NBCE with random seeds (8 random seeds for subcarrier spacing (SCS)=15 kHz and 4 seed, 0-3, for SCS=30 kHz). The training result is summarized in Table 1.

TABLE 1

| W | F | H | EVM % | Number of samples | Compressed Ratio |
|---|---|---|-------|-------------------|------------------|
| 10 | 8 | 8  | 0.7290 | 16698586 | 3.6 |
| 10 | 8 | 9  | 0.5668 | 16698586 | 3.2 |
| 10 | 8 | 10 | 0.3311 | 16698586 | 2.88 |
| 11 | 9 | 8  | 0.7088 | 16698586 | 3.27 |
| 11 | 9 | 9  | 0.5333 | 16698586 | 2.91 |
| 11 | 9 | 10 | 0.2683 | 16698586 | 2.62 |

Polar compression shares the same dataset (NR-FR1 dataset) as Cartesian compression but with different normalization. The original samples are in the Cartesian format and are converted to the polar representation by Equations (31) and (32):

$$r = \sqrt{x^2 + y^2} \qquad (31)$$

$$\theta = \tan^{-1}\frac{y}{x} \qquad (32)$$

and then are fed into the 24-node network. Particularly, for FXP (12s, 12s), the magnitude is normalized (divided by 2048), as in Equation (33):

$$r = \frac{\sqrt{x^2 + y^2}}{2048} \times \frac{1}{\sqrt{2}} - 1, \qquad (33)$$

such that the range of magnitude is in [−1, 1] while phase is normalized as in Equation (34).

$$\theta = \tan^{-1}\frac{y}{x} \times \frac{1}{\pi} \qquad (34)$$

The range of phase is in [−1, 1] as well.

As described above, there are two types of loss functions for polar compression. Both training results described in the following subsections. Also, the network could only use 24-node network due to different distributions for magnitude and phase.

The neural network is trained by the NR-FR1 dataset at SNR, in {10, 12, . . . , 42} dB on both BBGE/NBCE with random seeds (8 seeds, 0-7, for SCS=15 kHz and 4 seed, 0-3, for SCS=30 kHz), which is the same as its counterpart in Cartesian coordinates. The training result is summarized in Table 2. The loss function used here is in Equation (30).

TABLE 2

| H | W | F | EVM % |
|---|---|---|-------|
| 8 | 10 | 8 | 7.2403 |
| 12 | 10 | 8 | 3.8593 |
| 16 | 10 | 8 | 0.2433 |
| 20 | 10 | 8 | 0.1382 |
| 24 | 10 | 8 | 0.1314 |

The neural network is trained as the same settings as previous section but with a polar loss function as described above. The training result is summarized in Table 3. The results is similar to that on Cartesian loss function above.

TABLE 3

| H | W | F | EVM % |
|---|---|---|-------|
| 8 | 10 | 8 | 6.772 |
| 12 | 10 | 8 | 3.6256 |
| 16 | 10 | 8 | 0.2047 |
| 20 | 10 | 8 | 0.1257 |
| 24 | 10 | 8 | 0.1166 |

The dataset for NR-FR2 network is generated from NR FR2 settings (SCS=120 kHz, EPA channel, carrier frequency 28 GHZ) with BBCE in SNR $\in\{24, 26, \ldots, 40\}$. For NR-FR2, different weights/bias of the neural network needs to be trained based on FR2 channel estimation samples, instead of sharing with FR1 because the performance of compression is not good when NR-FR1 network is applied directly to NR-FR2 simulations.

The details of parameters and training results on this NR-FR2 dataset are listed in the Table 4, including the word length, fractional bits, the number of hidden layer nodes, the number of samples and compressed ratios.

TABLE 4

| W | F | H | EVM % | Number of samples | Compressed Ratio |
|---|---|---|-------|-------------------|------------------|
| 10 | 8 | 8 | 0.6916 | 9785319 | 3.6 |
| 10 | 8 | 9 | 0.6668 | 9785319 | 3.2 |
| 10 | 8 | 10 | 0.6257 | 9785319 | 2.88 |
| 11 | 9 | 8 | 0.6557 | 9785319 | 3.27 |
| 11 | 9 | 9 | 0.6257 | 9785319 | 2.91 |
| 11 | 9 | 10 | 0.5985 | 9785319 | 2.62 |

The MRS is configured with LTE ECP mode. The details of information on training LTE MRS test cases, are listed in Table 5, including the word length, fraction length, the number of nodes at the hidden layer, the number of samples, and compressed ratios. The DIM values are larger than those trained with PDSCH-DMRS, which means the compression is harder for MRS.

TABLE 5

| W | F | H | EVM % | Compressed Ratio |
|---|---|---|-------|------------------|
| 8 | 6 | 9 | 2.65 | 3.67 |
| 8 | 6 | 10 | 1.78 | 3.3 |
| 9 | 7 | 9 | 2.61 | 3.26 |
| 9 | 7 | 10 | 1.72 | 2.93 |
| 10 | 8 | 9 | 2.6 | 2.93 |
| 10 | 8 | 10 | 1.7 | 2.64 |
| 11 | 9 | 9 | 2.59 | 2.67 |
| 11 | 9 | 10 | 1.69 | 2.4 |
| 12 | 10 | 9 | 2.58 | 2.44 |
| 12 | 10 | 10 | 1.69 | 2.2 |

Also, in Table 5 the compression ratio is different from PDSCH-DMRS 24 input node network with FXP mode since the number of bits per input to the network is 11. Hence, during the training procedure, the normalization factor applying to the inputs is 1024, instead of 2048, since MRS with FXP mode is (11s, 11s), instead of (12s, 12s).

For modern development, channel estimation is inevitably needed to proceed to the detection and decoding of transmit signals. In practice, the channel estimation process is quite complicated under the pipeline operation and requires finer timing adjustments to coordinate many blocks properly. To accommodate this kind of requirement for modern development, the channel estimation needs a buffer to store intermediate results and control the timing of the many client blocks.

According to the present disclosure, the number of elements are reduced via an autoencoder. The neural network would figure out how numbers are correlated to each other. Hence, 6 elements could be reduced to, for example, 2 elements, and those 2 numbers may then be expressed with the proper bitwidth. As a result, both the number of elements and the bitwidth can be reduced in order to improve the compression ratio.

The present disclosure provides per-RIB compression. In NR 5G resource allocation, there may be many units to allocate resources, e.g., a resource block group (RBG), a bundle, a RE, RB, a bandwidth part (BWP), etc. There will be trade-off for each unit of resource allocation to compress. The system utilizes an RB-based compression with many reasonable supports. Because the compression unit is a single RB, it can be applied to a DMRS, a tracking reference signal (IRS), a secondary synchronization signal (SSS), etc.

The present disclosure provides universal application to bundle-based/non-bundle based channel estimation. The system is universally applicable to both bundle-based and non-bundle-based channel estimation algorithms, and also to all RSs202 (DMRS, TRS, SSS, etc.) in general. That is, the system is universally applied to both channel estimation algorithms regardless of bundle configuration.

The present disclosure provides channel compression with an autoencoder, including Cartesian compression and polar compression. The deep learning architecture, autoencoder, is applied to channel buffer compression for 5G NR with a unit of per-RB and universally to both bundle-based/non-bundle-based channel estimation and to all reference signals. The deep learning algorithm may be applied to compress channel estimation for 5G modem.

The present disclosure provides a neural network that can be built with either 24-input or 12-input architecture, which impacts the network size/complexity/etc. The per-RB (i.e., 12 subcarriers) compression can be realized via an autoencoder network with a 24-node input (i.e., taking both real and imaginary values together, and using a network once) or with a 12-node network (i.e., taking both real and imaginary values sequentially, and using a network twice, one for real and the other for imaginary), if Cartesian compression is performed. The same also applies to polar compression with magnitude and phases, rather than real and imaginary values.

Figure 9:
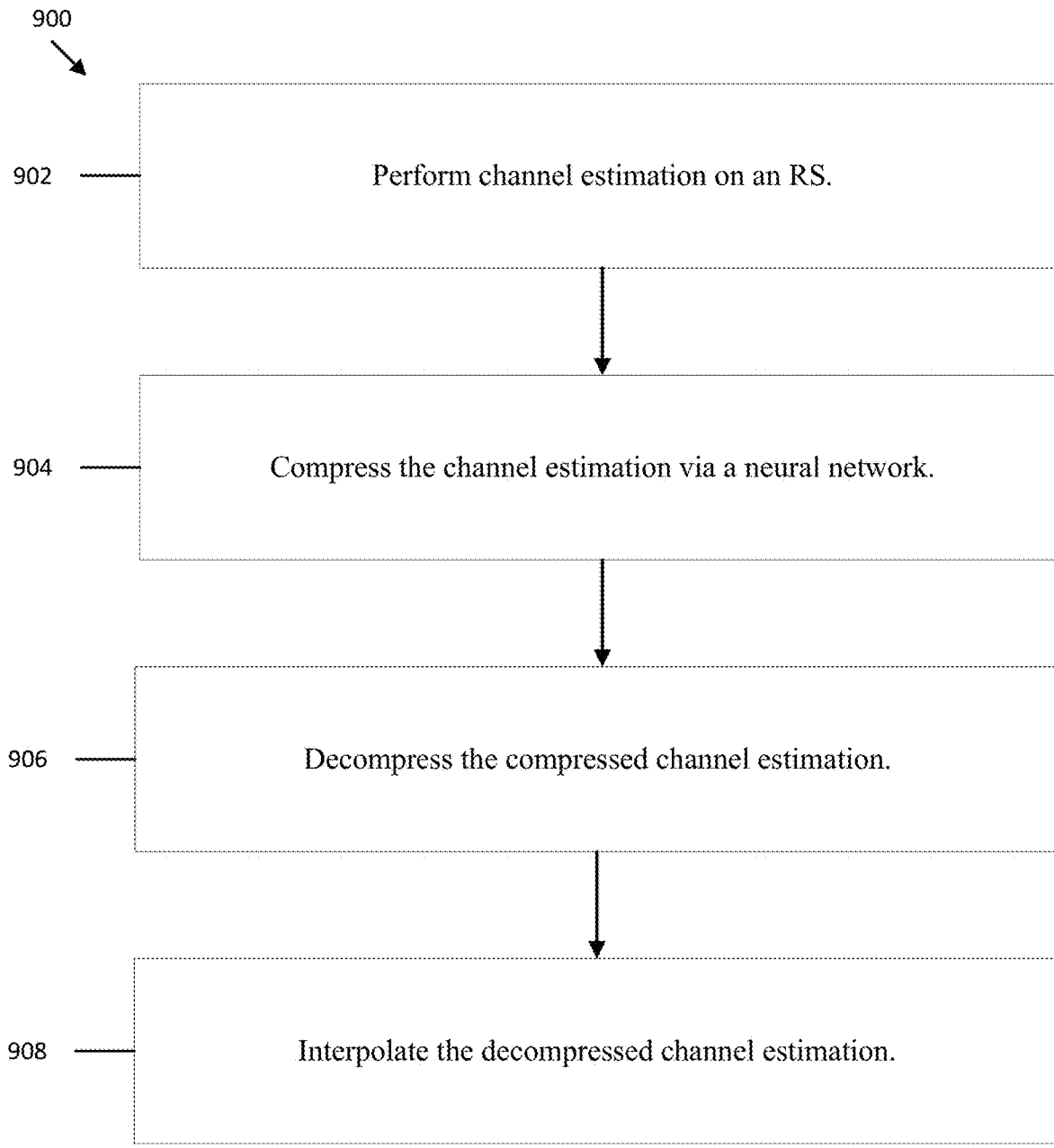
FIG. 9 illustrates a flowchart for a method of channel estimation, according to an embodiment.

FIG. 9 illustrates a flowchart 900 for a method of channel estimation, according to an embodiment. Any of the components or any combination of the components described (i.e., in the device diagrams) can be used to perform one or more of the operations of the flowchart 900. The operations depicted in the flowchart 900 are example operations and may involve various additional steps not explicitly provided in the flowchart 900. The order of the operations depicted in flowchart 900 is exemplary and not exclusive, as the order may vary depending on the implementation.

At 902, the system performs channel estimation on an RS. At 904, the system compresses the channel estimation via a neural network. The system may compress the channel estimation at each RB of the RS. At 906, the system decompresses the compressed channel estimations. At 908, the system interpolate the decompressed channel estimation.

Figure 10:
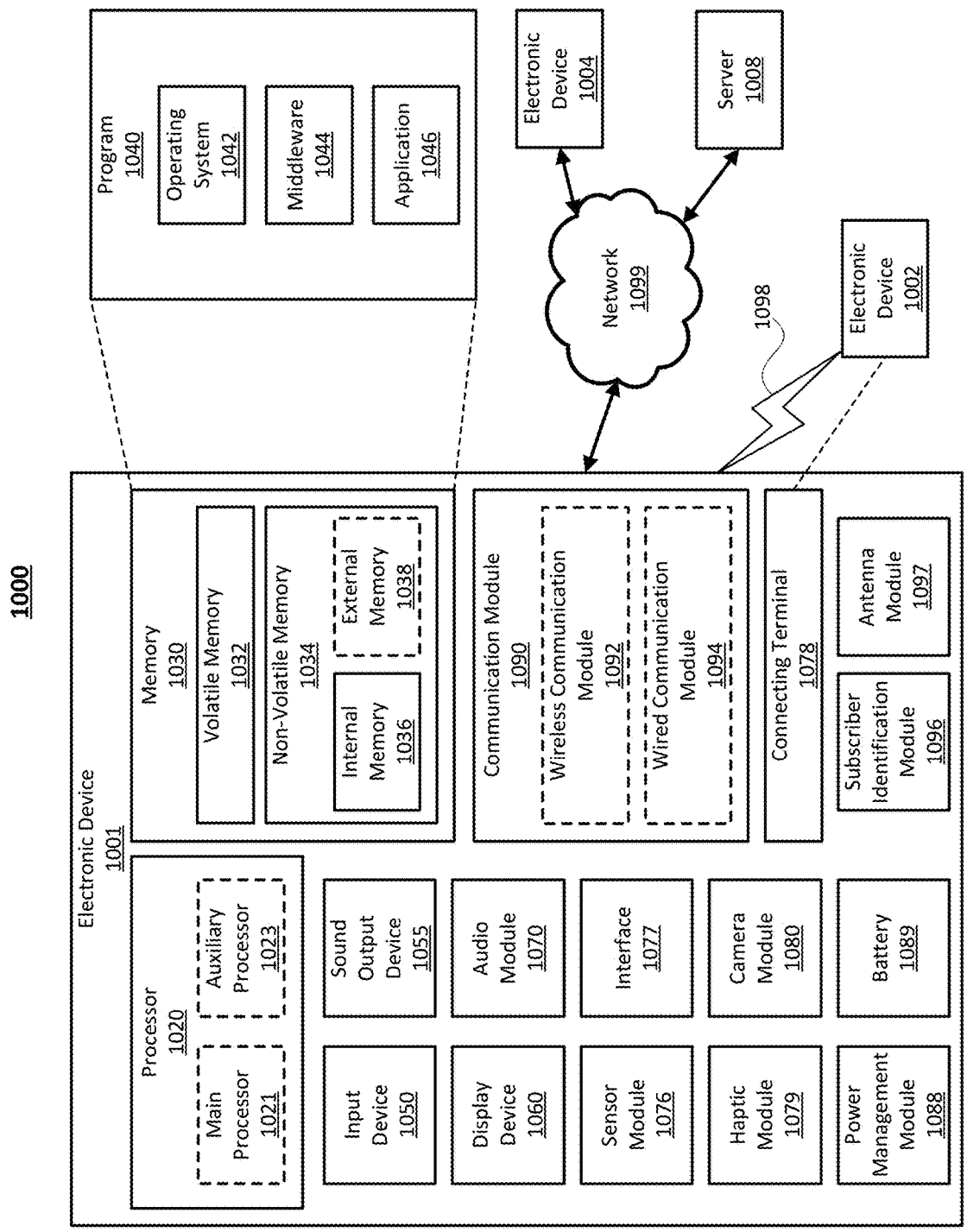
FIG. 10 illustrates a block diagram of an electronic device in a network environment, according to one embodiment.

FIG. 10 illustrates a block diagram of an electronic device 1001 in a network environment 1000, according to one embodiment. Referring to FIG. 10, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). The electronic device 1001 may communicate with the electronic device 1004 via the server 1008. The electronic device 1001 may include a processor 1020, a memory 1030, an input device 1050, a sound output device 1055, a display device 1060, an audio module 1070, a sensor module 1076, an interface 1077, a haptic module 1079, a camera module 1080, a power management module 1088, a battery 1089, a communication module 1090, a subscriber identification module (SIM) 1096, or an antenna module 1097. In one embodiment, at least one (e.g., the display device 1060 or the camera module 1080) of the components may be omitted from the electronic device 1001, or one or more other components may be added to the electronic device 1001. In one embodiment, some of the components may be implemented as a single integrated circuit (IC). For example, the sensor module 1076 (e.g., a fingerprint sensor, an iris sensor, or an illuminance sensor) may be embedded in the display device 1060 (e.g., a display).

The processor 1020 may execute, for example, software (e.g., a program 1040) to control at least one other component (e.g., a hardware or a software component) of the electronic device 1001 coupled with the processor 1020, and may perform various data processing or computations. As at least part of the data processing or computations, the processor 1020 may load a command or data received from another component (e.g., the sensor module 1076 or the communication module 1090) in volatile memory 1032, process the command or the data stored in the volatile memory 1032, and store resulting data in non-volatile memory 1034. The processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or execute a particular function. The auxiliary processor 1023 may be implemented as being separate from, or a part of, the main processor 1021.

The auxiliary processor 1023 may control at least some of the functions or states related to at least one component (e.g., the display device 1060, the sensor module 1076, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to one embodiment, the auxiliary processor 1023 (e.g., an image signal processor or a communication processor) may be implemented as part of another component (e.g., the camera module 1080 or the communication module 1090) functionally related to the auxiliary processor 1023.

The memory 1030 may store various data used by at least one component (e.g., the processor 1020 or the sensor module 1076) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by other component (e.g., the processor 1020) of the electronic device 1001, from the outside (e.g., a user) of the electronic device 1001. The input device 1050 may include, for example, a microphone, a mouse, or a keyboard.

The sound output device 1055 may output sound signals to the outside of the electronic device 1001. The sound output device 1055 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 1060 may visually provide information to the outside (e.g., a user) of the electronic device 1001, The display device 1060 may include, for example, a display, a hologram device, or a projector and control circuitry to control a corresponding one of the display, hologram device, and projector. According to one embodiment, the display device 1060 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to one embodiment, the audio module 1070 may obtain the sound via the input device 1050, or output the sound via the sound output device 1055 or a headphone of an external electronic device 1002 directly (e.g., wired) or wirelessly coupled with the electronic device 1001.

The sensor module 1076 may detect an operational state (e.g., power or temperature) of the electronic device 1001 or an environmental state (e.g., a state of a user) external to the electronic device 1001, and then generate an electrical signal or data value corresponding to the detected state. The sensor module 1076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device 1002 directly (e.g., wired) or wirelessly. According to one embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device 1002. According to one embodiment, the connecting terminal 1078 may include, for example, an HDMI connector, a USB connector, an SD card connector, or an audio connector (e.g., a headphone connector).

The haptic module 1079 may convert an electrical signal into a mechanical stimulus (e.g., a vibration or a movement) or an electrical stimulus which may be recognized by a user via tactile sensation or kinesthetic sensation. According to one embodiment, the haptic module 1079 may include, for example, a motor, a piezoelectric element, or an electrical stimulator.

The camera module 1080 may capture a still image or moving images. According to one embodiment, the camera module 1080 may include one or more lenses, image sensors, image signal processors, or flashes.

The power management module 1088 may manage power supplied to the electronic device 1001. The power management module 1088 may be implemented as at least part of, for example, a power management integrated circuit (PMIC).

The battery 1089 may supply power to at least one component of the electronic device 1001. According to one embodiment, the battery 1089 may include, for example; a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the AP) and supports a direct (e.g., wired) communication or a wireless communication. According to one embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or a standard of the infrared Data Association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to one embodiment, the antenna module 1097 may include one or more antennas, and, therefrom, at least one antenna appropriate for a communication scheme used in the communication network, such as the first network 1098 or the second network 1099, may be selected, for example, by the communication module 1090 (e.g., the wireless communication module 1092). The signal or the power may then be transmitted or received between the communication module 1090 and the external electronic device via the selected at least one antenna.

At least some of the above-described components may be mutually coupled and communicate signals (e.g., commands or data) there between via an inter-peripheral communication scheme (e.g., a bus, a general purpose input and output (GPIO), a serial peripheral interface (SPI), or a mobile industry processor interface (MIN)).

According to one embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. All or some of operations to be executed at the electronic device 1001 may be executed at one or more of the external electronic devices 1002, 1004, or 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

One embodiment may be implemented as software (e.g., the program 1040) including one or more instructions that are stored in a storage medium (e.g., internal memory 1036 or external memory 1038) that is readable by a machine (e.g., the electronic device 1001). For example, a processor of the electronic device 1001 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) ay be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method, comprising:
   performing, by a processor of a system, channel estimation on a reference signal (RS);
   compressing, by the processor, the channel estimation for a resource block (RB) of the RS using a compressor of a neural network to generate a RB-compressed channel estimation;
   storing, at a buffer of the system, the RB-compressed channel estimation;
   decompressing, by the processor, the RB-compressed channel estimation using a decompressor of the neural network to generate a decompressed channel estimation; and
   interpolating, by the processor, the decompressed channel estimation for detection of a channel.

2. The method of claim 1, wherein the neural network includes an autoencoder.

3. The method of claim 2, wherein the autoencoder is a 24-input neural network.

4. The method of claim 2, wherein the autoencoder is a 12-input neural network.

5. The method of claim 1, further comprising extracting, from the buffer, the RB-compressed channel estimation prior to decompressing the compressed channel estimation.

6. The method of claim 1, wherein the channel estimation is compressed by Cartesian compression.

7. The method of claim 6, wherein Cartesian compression is performed utilizing a mean squared error (MSE) and an error vector magnitude (EVM).

8. The method of claim 1, wherein the channel estimation is compressed by polar compression.

9. The method of claim 1, further comprising estimating a shared exponent when channel estimated values are expressed in a floating-point format.

10. A system, comprising:
    a buffer;
    a memory, and
    a processor configured to:
      perform channel estimation on a reference signal (RS);
      compress, with a compressor of a neural network, the channel estimation for a resource block (RB) of the RS to generate a RB-compressed channel estimation;
      store the RB-compressed channel estimation at the buffer;
      decompress, with a decompressor of the neural network, the RB-compressed channel estimation to generate a decompressed channel estimation; and
      interpolate the decompressed channel estimation for detection of a channel.

11. The system of claim 10, wherein the neural network includes an autoencoder.

12. The system of claim 11, wherein the autoencoder is a 24-input neural network.

13. The system of claim 11, wherein the autoencoder is a 12-input neural network.

14. The system of claim 10, wherein the processor is further configured to extract, from the buffer, the compressed channel estimation prior to decompressing the compressed channel estimation.

15. The system of claim 10, wherein the channel estimation is compressed by Cartesian compression.

16. The system of claim 15, wherein Cartesian compression is performed utilizing a mean squared error (MSE) and an error vector magnitude (EVM).

17. The system of claim 10, wherein the channel estimation is compressed by polar compression.

18. The system of claim 10, wherein the processor is further configured to estimate a shared exponent when channel estimated values are expressed in a floating-point format.

* * * * *